United States Patent
James

(10) Patent No.: US 7,271,036 B2
(45) Date of Patent: Sep. 18, 2007

(54) LEADFRAME ALTERATION TO DIRECT COMPOUND FLOW INTO PACKAGE

(75) Inventor: Stephen L. James, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/215,233

(22) Filed: Aug. 30, 2005

(65) Prior Publication Data

US 2005/0287712 A1    Dec. 29, 2005

Related U.S. Application Data

(62) Division of application No. 10/246,615, filed on Sep. 17, 2002, now Pat. No. 7,053,467, which is a division of application No. 09/898,345, filed on Jul. 3, 2001, now Pat. No. 6,451,629, which is a division of application No. 09/489,113, filed on Jan. 21, 2000, now Pat. No. 6,278,175.

(51) Int. Cl.
H01L 21/00    (2006.01)
H01L 23/495    (2006.01)

(52) U.S. Cl. .............. 438/123; 257/667; 257/674; 257/E23.048; 257/E21.51

(58) Field of Classification Search ........... 438/123; 257/667, 674
See application file for complete search history.

(56) References Cited

U.S. PATENT DOCUMENTS

| | | | |
|---|---|---|---|
| 5,018,003 A | 5/1991 | Yasunaga et al. | |
| 5,197,183 A | 3/1993 | Chia et al. | |
| 5,252,784 A | 10/1993 | Asai et al. | |
| 5,661,337 A | 8/1997 | Manteghi | |
| 5,663,104 A | 9/1997 | Fukuyama | |
| 5,684,327 A | 11/1997 | Nakazawa et al. | |
| 5,753,977 A | 5/1998 | Kusaka et al. | |
| 5,754,977 A | 5/1998 | Kusaka et al. | |
| 5,777,380 A | 7/1998 | Otsuki et al. | |
| 5,783,860 A | 7/1998 | Jeng et al. | |
| 5,872,395 A | 2/1999 | Fujimoto | |
| 5,926,695 A | 7/1999 | Chu et al. | |
| 5,932,923 A | 8/1999 | Kim et al. | |
| 5,936,837 A | 8/1999 | Scribner et al. | |
| 5,965,078 A | 10/1999 | Bolanos et al. | |
| 5,973,407 A | 10/1999 | Tzu et al. | |
| 6,057,595 A | 5/2000 | Pohl et al. | |
| 6,278,175 B1 * | 8/2001 | James | 257/666 |
| 6,451,629 B2 * | 9/2002 | James | 438/124 |
| 7,053,467 B2 * | 5/2006 | James | 257/666 |
| 2001/0053566 A1 | 12/2001 | James | |

* cited by examiner

Primary Examiner—David A. Zarneke
(74) Attorney, Agent, or Firm—Knobbe Martens Olson & Bear LLP

(57) ABSTRACT

A leadframe comprising a downset formed adjacent to an edge of the leadframe so as to direct the molding compound to flow evenly inside the mold cavity. The downset has an upward slope extending from the edge of the frame and levels off with the rest of the frame at a first transition point. The upward slope facilitates the upward flow of the molding compound entering from a bottom gate. Likewise, the leadframe also directs flow in a top gated mold by reversing the orientation of the leadframe or by forming a reverse downset on the leadframe.

9 Claims, 3 Drawing Sheets

LEADFRAME ALTERATION TO DIRECT COMPOUND FLOW INTO PACKAGE

RELATED APPLICATIONS

This application is a divisional application of U.S. application Ser. No. 10/246,615, now U.S. Pat. No. 7,053,467 filed Sep. 17, 2002, which is a divisional application of U.S. application Ser. No. 09/898,345, now U.S. Pat. No. 6,451,629 filed Jul. 3, 2001 which is a divisional application of U.S. application Ser. No. 09/489,113, now U.S. Pat. No. 6,278,175 filed Jan. 21, 2000. The entirety of all these applications is incorporated by reference herein.

BACKGROUND OF THE INVENTION

1. Field of the Invention

This invention relates to packaging of semiconductor integrated circuits and, more particularly, to a leadframe that directs the molding compound to flow evenly into the package during the encapsulation process.

2. Description of the Related Art

Semiconductor packaging generally involves incorporating completely fabricated chips, generally referred to as a die, into protective packages so that the dies are protected from environmental contaminants and handling damage. A common method for packaging integrated circuits comprises bonding each die to a leadframe and subsequently encapsulating the die and a portion of the leadframe in a molded epoxy enclosure. Generally, the leadframe has paddles that receive the die and also has lead fingers that provide easier contact points for external electrical connection to the electronic components of the die. Hence, the leadframe provides structural support for the die and allows the encapsulated die to establish connection with external structures such as printed circuit boards.

More particularly, the leadframe is typically made from a thin sheet of metal and the die paddle that is configured to receive the die is typically downwardly recessed to the rest of the frame so as to accommodate for the thickness of the die mounted to the paddle. Furthermore, the leadframe comprises a plurality of leadframe fingers that are either stamped or etched on the leadframe and extend from an edge of the die paddle to an edge of the leadframe. An inner end of each leadframe finger is wire bonded to a bonding pad on the die while an outer end of each finger is designed to form contacts with external structures so as to establish a plurality of conductive paths between the die and the external structures. The number and configuration of leadframe fingers vary depending on the particular die design.

Moreover, an inner section of each leadframe finger and the die itself are typically encapsulated in a plastic enclosure so that they are protected from damage and contaminants. During the encapsulation process, the die is initially bonded to the leadframe and the die and leadframe structure is placed in a mold cavity wherein the configuration of the cavity defines the shape and size of the resulting protective enclosure. Furthermore, a molding compound such as plastic resin is injected into the cavity so as to complete the formation of a typically rectangular shaped enclosure that protects the die and the inner sections of the leadframe fingers. Advantageously, the molding operation can be set up so that multiple dies can be encapsulated in a single process run, thereby providing a cost effective and efficient way of packaging integrated circuits.

However, one disadvantage of the standard encapsulation process is that the mold cavity configuration and positioning of the leadframe therein preclude the molding compound from flowing evenly inside the cavity. This can cause an uneven distribution of resin around the die and the leadframe resulting in a less effective protective structure. In particular, the mold cavity typically comprises a top and a bottom plate that mate to form the cavity. The leadframe is placed in the middle of the cavity between the two plates. Furthermore, the mold is typically designed so that the molding compound or resin enters the cavity from an opening or gate formed in one corner of the mold. In a bottom gated mold configuration, for instance, the molding compound enters the cavity from a bottom corner and the molding compound fills the bottom portion of the cavity more quickly than it fills the top portion of the cavity. Hence, molding compound entering from a bottom gated mold tends to conglomerate near the bottom of the cavity because its upward flow path is hindered by numerous horizontally extended leadframe fingers. Likewise, in a top gated mold configuration, the flow of the molding compound also can conglomerate in the top portion of the cavity as the downward flow path is obstructed by the horizontally extended leadframe fingers. Disadvantageously, non-uniform compound flow rate in the mold and uneven resin distribution between the top and bottom surface of the leadframe are known to cause defects such as voids, pinholes, and knitlines in the cured plastic enclosure.

To address this problem, mold design modifications and leadframe alterations have been developed in the past in an effort to achieve a more uniform resin flow inside the mold cavity. For example, U.S. Pat. No. 5,965,078 discloses a mold design used in combination with prepackaged molding compound inserts that are inserted in the cavity of the mold with the leadframe and die so as to provide a more uniform compound flow inside the cavity. However, it can be appreciated that mold modifications with prepackaged inserts are costly to implement and therefore undesirable in light of the ever increasing demand for cost reduction in semiconductor fabrication.

The prior art also discloses a leadframe having one or more encapsulate diverters wherein the flow diverters are designed to guide portions of the upper resin flow to a bottom section of the cavity. (See e.g., U.S. Pat. No. 5,926,695). However, the flow diverter as taught by prior art is applicable only for molds that are top gated wherein the resin is introduced from a top corner of the mold. Furthermore, the diverter is positioned away from the gate and therefore unable to direct the flow of the compound at the point where the resin first enters the cavity. In fact, the diverter is designed to guide the resin flow only after the resin has already reached the paddle area where air pockets that are known to cause voids and pinholes are likely to have already developed. Moreover, the leadframe diverters as suggested by prior art are essentially unsupported flaps that can be easily damaged during the encapsulation process. In particular, it can be appreciated that an unsupported thin layer of metal bent at an angle can be deformed or broken off by the flow of the compound injected into the mold cavity. Furthermore, leadframes with the flow diverters as suggested by prior art are time consuming to manufacture as it requires additional processing steps to ensure that the diverters bend at a particular angle relative to the leadframe.

Further, the flow diverter disclosed in the patent also requires that space on the die paddle be occupied by the opening to permit the resin to flow through. It will be appreciated that given the ever increasing need for greater density devices, the space on the die paddles and on the lead frame is becoming increasingly limited. Hence, for many high density leadframe designs, forming openings simply for resin flow is impractical and inefficient.

Hence, from the foregoing, it will be appreciated that there is a need for a leadframe wherein the leadframe directs the flow of the molding compound to flow more evenly inside the mold cavity during the encapsulation process. To this end, there is particular need for an altered leadframe that is able to guide the flow of the compound as the compound enters the cavity so as to achieve a uniform resin flow rate from the outset and thereby minimize defects such as pinholes, voids and knitlines in the molded enclosure. Furthermore, it is desirable that the leadframe is effective in directing compound flow in both top and bottom gated molds. Furthermore, it is also desirable that such leadframe alterations can be implemented quickly and cost effectively.

SUMMARY OF THE INVENTION

The aforementioned needs are satisfied by the leadframe of the present invention. In one aspect, the present invention discloses a leadframe wherein the leadframe comprises a plurality of lead fingers and a die paddle adapted to receive the die and a second offset positioned adjacent an edge of the leadframe. In this aspect, the second offset is positioned so as to increase the pressure differential between the first and the second surfaces of the leadframe so as to increase the flow of compound from the first surfaces to the second surface via the spaces between the plurality of lead fingers. In this way, the flow of compound can be increased without requiring limited space on the leadframe be occupied by flow openings and the like.

In one embodiment, the offset comprises a downset comprising a downward indentation formed on a top surface of the leadframe wherein a top surface of the indentation slopes upwardly towards the paddle until it becomes level with a general plane defined by the top surface of the leadframe.

In one embodiment, the leadframe further comprises a tie bar wherein an outer end of the tie bar is generally triangular and comprises the offset. Preferably, in an encapsulation process, the leadframe is placed inside a mold cavity in a manner such that the offset is positioned adjacent a gate. Preferably, the offset is designed to receive a portion of the molding compound entering from the gate and guide the portion to flow toward the second surface of the leadframe. In particular, the offset produces a localized increase in the pressure of the compound flowing from the gate. This localized increase in pressure results in a greater pressure differential between the side of the leadframe adjacent the gate and the side opposite the gate thereby increasing the flow from the side adjacent the gate to the side opposite the gate.

Advantageously, the altered leadframe of the preferred embodiment provides an offset comprising a sloped surface strategically positioned to facilitate the flow of the molding compound as the compound enters the cavity from a gate. In particular, the altered leadframe splits the flow of the compound as the compound enters from a gate so as to ensure a more even distribution of the compound between the top and bottom of the leadframe.

From the foregoing, it will be appreciated that the aspects of the present invention provide a new, altered leadframe that is designed to direct molding compound to flow more evenly inside a mold cavity in a cost-effective manner. Moreover, the altered leadframe can be adapted to direct compound flow inside mold cavities that are either top or bottom gated. These and other objects and advantages of the present invention will become more apparent from the following description taken in conjunction with the following drawings.

DETAILED DESCRIPTION OF THE PREFERRED EMBODIMENT

Reference will now be made to the drawings wherein like numerals refer to like parts throughout. As will be described hereinbelow, the leadframe of the preferred embodiment provides a leadframe that effectively directs the molding compound to flow evenly around the die and leadframe during encapsulation so as to reduce voids and pinholes in the encapsulated lead frame that typically result from uneven resin flow inside the mold cavity.

Figure 1:
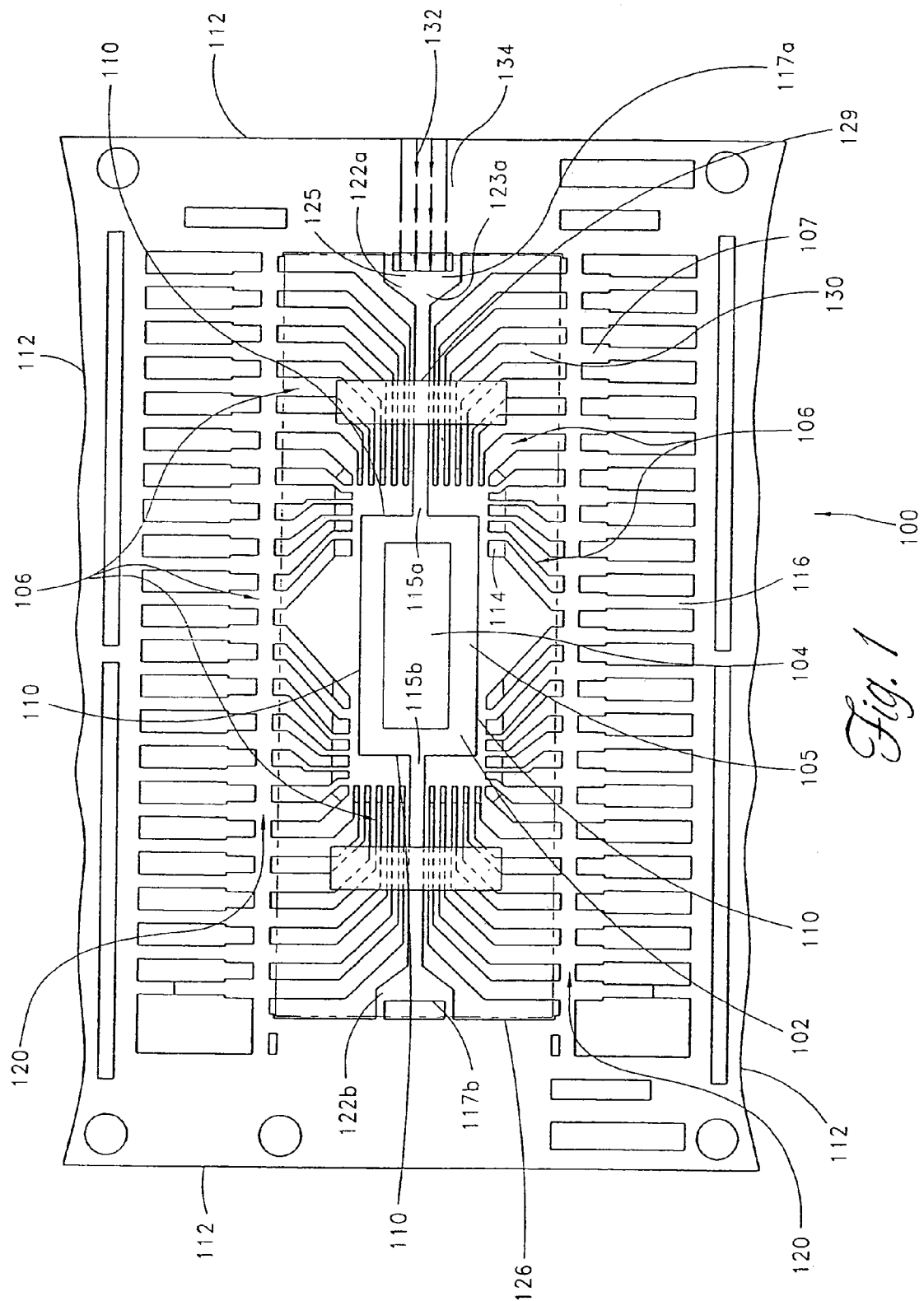
FIG. 1 is a top down view of a leadframe of the preferred embodiment.

FIG. 1 illustrates a general top down view of a leadframe 100 of the preferred embodiment. As is shown in FIG. 1, the leadframe 100 is generally rectangular in shape and is typically made from a thin sheet of metal such as a copper or nickel alloy. As will be described in greater detail below, the leadframe 100 is designed to provide structural support for a die or chip and also facilitate electrical interconnection to the components formed on the die. In the typical packaging process, the die is encapsulated in a plastic enclosure. Furthermore, the leadframe 100 is also configured to provide a plurality of conductive paths between the encapsulated die and external structures such as printed circuit boards.

As is illustrated in FIG. 1, the leadframe 100 comprises a die paddle 102 that is a generally rectangular region located in the center of the leadframe 100 and is formed by a well known stamping or etching process. In particular, the paddle 102 is configured to seat a die 104 and defines a seating surface 105 that is generally larger than the dimensions of the die 104. Preferably, the paddle 102 is also recessed or downset relative to the rest of the leadframe 100 so as to accommodate the thickness of the die 104 that is bonded to the paddle 102.

Furthermore, as is also shown in FIG. 1, the leadframe 100 comprises a plurality of leadframe fingers 106 that are generally elongated and extend from an edge 110 of the die paddle 102 to an edge 112 of the leadframe 100. Preferably, the leadframe fingers 106 are also formed by stamping or etching the leadframe 100 using a method well known in the art. Furthermore, an inner end 114 of each finger 106 is typically wired bonded to the die 104, while an outer end 116 of each finger 106 is adapted to connect with external structures such as a printed circuit board. The leadframe fingers 106 thus effectively serve as a plurality of conductive paths between the die 104 and external structures.

As FIG. 1 further illustrates, each leadframe finger 106 extends outwardly from the edge 110 of the paddle 102 to a dambar 120. Preferably, the dambar 120 has an elongated shape and is formed by the same etching or stamping process that is used to create the paddle 102 and the fingers 106 on the leadframe 100. As is also shown in FIG. 1, each dambar 120 spans in a direction generally perpendicular to the leadframe fingers 106 and is positioned approximately halfway between the edge 110 of the paddle 102 and the edge 112 of the leadframe 100. In particular, the dambar 120 is connected to each of the leadframe fingers 106 so as to provide rigidity and structural support for the fingers 106 during the encapsulation process during which the fingers are susceptible to damage. Furthermore, the dambars 120 also block and prevent the molding compound from streaking onto an outer section 107 of the fingers 106 during encapsulation. Subsequent to encapsulation, the dambars 112 are severed from the fingers 106 in a singulation process that is well known in the art. In particular, the singulation process separates the fingers 106 from the dambar 112 so that the fingers 106 become disconnected from the dambar 112 and from each other.

As is also shown in FIG. 1, a plurality of tie bars 122a, 122b extend from the edge 110 of the paddle 102 to the edge 112 of the leadframe 100. Preferably, the tie bars 122a, 122b are generally elongated and are formed using a well known stamping or etching process. As shown in FIG. 1, the tie bars 122a, 122b ensure that the island-like paddle region 102 located in the center of the leadframe 100 is structurally connected to the rest of the frame 100. In particular, an inner end 115a, 115b of each tie bar 122a, 122b is connected to the edge 110 of the paddle 102 while an outer end 117a, 117b is attached to the edge 112 of the leadframe 100.

Furthermore, as shown in FIG. 1, a plurality of dashed lines 126 define a generally rectangular inner region of the leadframe 100 wherein the region comprises the die paddle 102 and an inner section 130 of the leadframe fingers 106 extending between the paddle 102 and the dambar 120. Preferably, once the die 104 is mounted to the paddle 102, the inner region of the leadframe 100 is encapsulated in an enclosure in a manner to be described in greater detail below. Preferably, during the encapsulation process, the inner region of the leadframe 100 is placed inside a mold cavity wherein molding compound is introduced into the cavity from an area adjacent the outer end 117a of one of the tie bars 122a.

In particular, a plurality of arrows 132 adjacent the outer end 117a of the tie bar 122a as shown in FIG. 1 indicate the general direction in which the molding compound flows into the cavity during the encapsulation process of a preferred embodiment. The arrows 132 show the molding compound entering the cavity from a gate 134 that is located adjacent the outer end 117a of the tie bar 122a. Preferably, the molding compound flows in a generally horizontal direction from a first gate, which, in this embodiment, is a bottom lower gate 134 of the cavity and fills the entire cavity so that the top and bottom sides of the leadframe are completely covered. Disadvantageously, however, the mold configuration and positioning of the leadframe inside the mold cavity often cause the resin to flow unevenly around the leadframe. In a bottom gated mold, for instance, the molding compound is shown to favor the bottom of the cavity because the upward resin flow is often hindered by the numerous horizontally extended leadframe fingers 106. Likewise, in a top gated mold wherein the compound enters from a top corner of the cavity, the molding compound is shown to gather more around the top of the leadframe as the downward resin flow is blocked by the horizontally extended fingers 106.

In the preferred embodiment, the leadframe 100 is altered so that the leadframe is able to direct the compound flow once the compound enters the cavity so as to more evenly split the compound between the top and bottom of the leadframe. In particular, the outer end 117a of the tie bar 122a positioned adjacent the gate 134 is offset or downset relative to the horizontally extended leadframe fingers 106 so as to facilitate the upward flow of the compound. As will be described in greater detail below, an indentation 125 is formed on a top surface 123a of the outer end 117a of the tie bar 122a. Preferably, the indentation 125 is comprises a first and a second sidewall forming a generally v-shaped groove. Each sidewall slopes upwardly until it becomes level with the general plane defined by the top surface of the leadframe 100.

Figure 2:
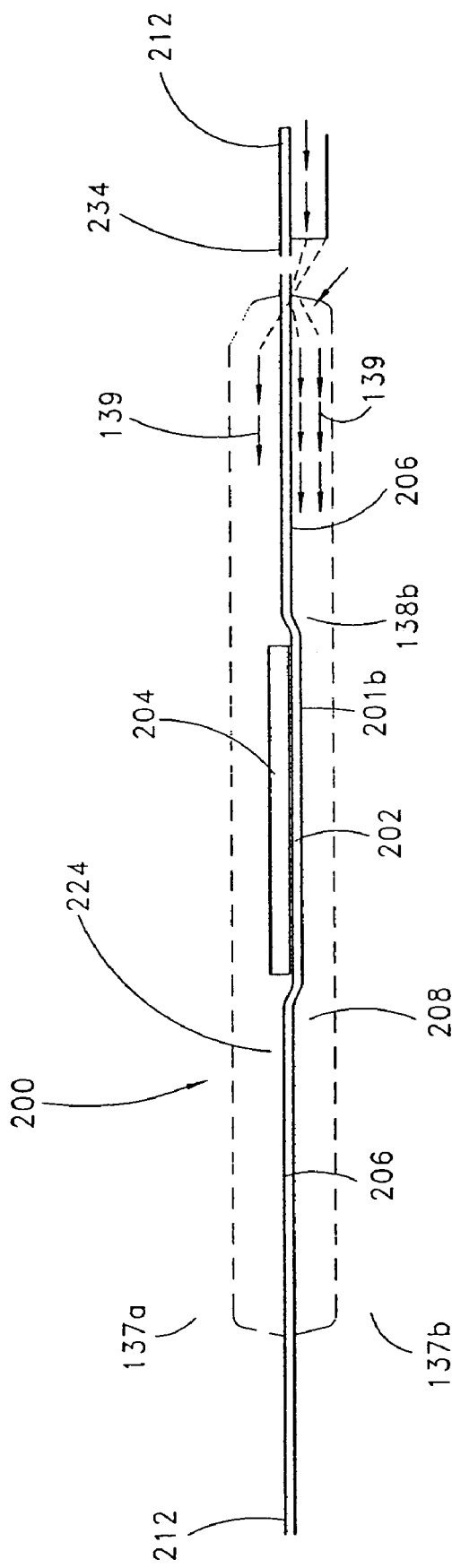
FIG. 2 is a partial schematic side view of a conventional leadframe positioned inside a mold cavity and the flow direction of the molding compound.

FIG. 2 provides a partial side view of a conventional prior art leadframe 200 positioned inside a mold cavity 208 during an encapsulation process. As shown in FIG. 2, the conventional leadframe 200 comprises a die paddle 202 that is downset and bonded to a die 204. Furthermore, a plurality of leadframe fingers 206 extend outwardly from the paddle 202 to an edge 212 of the leadframe 200. As is also illustrated in FIG. 2, the die 204 and an inner region 224 of the leadframe 200 are placed inside the mold cavity 208 defined by a top and bottom plate 137a, 137b. In particular, the mold cavity 208 defines a generally rectangular enclosure wherein the inner region 224 of the leadframe 200 is positioned horizontally across approximately the middle of the cavity 208. Furthermore, it is generally known that a mold typically has an injection port or a gate that is located on either the top or bottom corner of the cavity that comprises an opening which allows molding compound to enter the cavity. As is shown in FIG. 2, the illustrated mold 208 has a gate 234 that is formed on the bottom plate 137b, however it is appreciated that the gate can also be positioned on the top plate 137a.

As is also shown in FIG. 2, a plurality of arrows 139 demonstrate the path of the compound flow once the compound enters the mold cavity 208 through the bottom gate 234. The arrows 139 illustrate an uneven compound flow wherein more compound is shown to reach a bottom region 138b of the cavity and conglomerate around a bottom surface 201b of the leadframe 200. In particular, the upward flow path of the compound is obstructed by the horizontally extended leadframe fingers 206, therefore less compound is able to reach the top of the frame 200. Consequently, an uneven flow pattern as illustrated by the arrows 139 is known to cause defects such as pinholes, voids, and knitlines in the resulting plastic enclosure.

Figure 3:
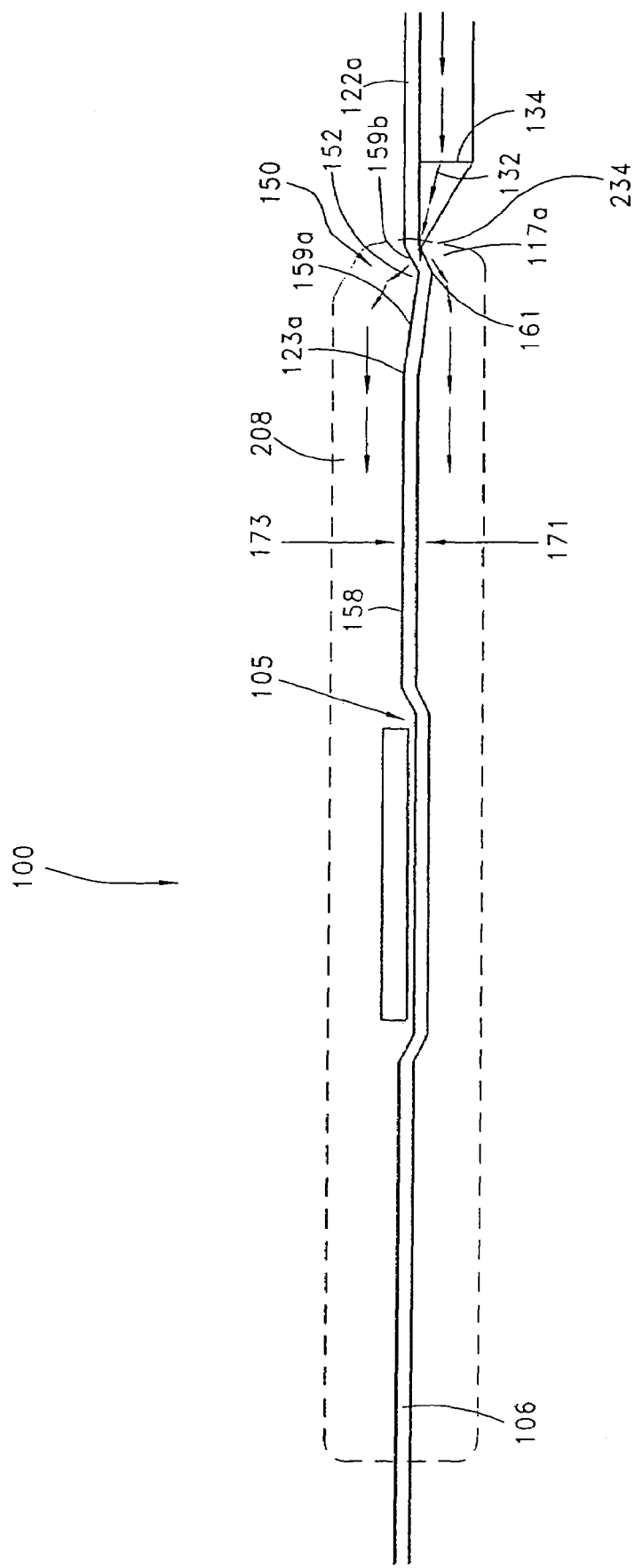
FIG. 3 is a partial schematic side view of the leadframe of the preferred embodiment positioned inside a molding cavity and the flow direction of the molding compound.

To minimize the occurrence of such defects, the leadframe 100 of the preferred embodiment is configured to direct resin to flow more evenly inside the mold cavity so as to minimize the formation of air pockets during encapsulation. With reference to FIG. 3, the leadframe 100 of the preferred embodiment is shown to be positioned inside a conventional bottom gated mold cavity as described in FIG. 2. As described in detail above, the leadframe 100 of the preferred embodiment generally comprises the paddle 102 bonded to the die 104 and numerous leadframe fingers 106 extending outwardly from the paddle 102. Furthermore, as illustrated in FIG. 3, the paddle 102 of the leadframe 100 comprises a first offset which, in this embodiment, is a first downset 105 that is a generally rectangular indentation formed by a known punch press operation and configured to accommodate the thickness of the die 104 that is seated in the paddle 102.

As is also shown in FIG. 3, the leadframe 100 of the preferred embodiment also has a second offset comprising a second downset 150 that is a generally v-shaped indentation 152 formed on the top surface 123a of the outer end 117a of the first tie bar 122a. Preferably, the indentation 152 is formed in the same punch press operation as that used to form the first downset 105. Preferably, the indentation 152 has a first and a second side wall 159a, 159b and each side wall slopes upwardly until it becomes level with a top surface 158 of the leadframe fingers 106. Furthermore, the length of the indentation extends from a top surface of the first side wall 159a to a top surface of the second sidewall 159b and the depth extends from a bottom 161 of the indentation to the top surface 158 of the leadframe fingers. As is illustrated in FIGS. 1 and 3, the indentation 152 comprising the second downset 150 is located on the end 117a of the first tie bar 122a so as to be immediately adjacent the compound gate 134. The indentation 152 preferably extends into the flow path 132 of the compound that is being injected into the mold 208 during the injection molding process. This results in the pressure of the compound at the injection port 234 being locally increased.

Hence, there is a greater pressure differential between the compound located adjacent the bottom surface 171 of the leadframe 100 than the upper surface 173 of the leadframe. As a result of this greater pressure differential, more of the compound that is entering adjacent the bottom surface 171 is induced to flow to the upper surface 173 through the openings between the lead fingers 106. Hence, as a result of this greater flow of compound, the formations of pinholes, knitlines and voids in the compound is reduced due to the more even distribution of injection resin or compound within the mold 208.

Furthermore, it can be appreciated that the above described altered leadframe can be adapted to direct the flow of compound inside a top gated mold. In particular, the leadframe 100 can be placed in an upside down orientation inside a top gated mold so that the second downset 150 will guide the compound entering from the top of the cavity to flow downwardly into the bottom plate. In particular, the leadframe 100 can be positioned upside down wherein a top surface 101 of the paddle 102 faces the bottom plate of the mold. Preferably, when the leadframe 100 is placed in an upside down orientation, the second downset 150 will facilitate the compound entering from the top gate to flow downwardly toward the bottom of the cavity. Preferably, the leadframe 100 directs the compound flow so as to more evenly direct the compound between the top and bottom of the plate and therefore minimize the formation of air pockets that cause defects such as pinholes, voids, and knitlines in the resulting enclosure.

Alternatively, the second offset 150 can also be formed in an upside down configuration wherein the indentation is formed on a bottom surface 158 of the first tie bar 122a. In one embodiment, the indentation protrudes upwardly so as to direct a portion of the compound entering from a top gate to flow downwardly to the bottom of the cavity. Preferably, the configuration of the second offset 150 is identical as the second downset 150 when the leadframe 100 is positioned upside down inside the mold cavity.

Advantageously, the alteration to the leadframe 100 is not costly to implement as it can be achieved with relative minor changes to a punch press die. Therefore, the present invention provides an altered leadframe wherein the frame allows the molding compound to flow evenly during the encapsulate molding process. The alteration is relatively inexpensive to implement as it involves an extra press operation that uses existing equipment and tools with minor modifications. Unlike known leadframe modifications, the altered leadframe effectively distributes the flow of the compound from the point when the compound first enters the mold so as to provide a more even flow from the outset.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention. Consequently, the scope of the present invention should not be limited to the foregoing discussions, but should be defined by the appended claims.

What is claimed is:

1. A method of directing encapsulating compound to flow more evenly around a leadframe inside a mold cavity, wherein the leadframe has a die paddle that is adapted to receive a die, a plurality of spaced lead fingers, and a tie bar adjacent the lead fingers and extending between the die paddle and an edge of the leadframe, the method comprising:
   forming an offset in the tie bar;
   positioning the leadframe in the mold cavity in a manner such that the offset is adjacent an injection port through which encapsulating compound is to be injected into the mold cavity;
   injecting encapsulating compound into the mold cavity such that a portion of the compound contacts the offset and a first surface of the leadframe; and
   directing the portion of the encapsulating compound wherein the offset exerts pressure on the portion of compound so that the compound flows through the spaces between the lead fingers and toward a second surface of the leadframe.

2. The method of claim 1, wherein forming an offset in the tie bar comprises forming an offset comprised of two sloping sidewalls that converge to form a protrusion extending from the first surface of the leadframe.

3. The method of claim 1, wherein directing the portion of the encapsulating compound comprises directing the compound flow to conform to the sloping sidewalls of the offset.

4. The method of claim 1, wherein injecting encapsulating compound into the mold cavity comprises injecting the compound through a bottom gated injection port.

5. The method of claim 1, wherein injecting encapsulating compound into the mold cavity comprises injecting the compound through a top gated injection port.

6. A leadframe, comprising:
   a die paddle;
   a plurality of spaced lead fingers positioned about the die paddle;
   a retaining structure for retaining the plurality of spaced lead fingers about the die paddle; and
   an indentation formed adjacent one edge of the leadframe, wherein the indentation is offset from the plane defined by the plurality of lead fingers.

7. The leadframe of claim 6, wherein the indentation comprises to converging sidewalls that extend from the plane defined by the plurality of lead fingers.

8. The leadframe of claim 7, wherein the sidewalls of the indentation protrude from a lower surface of the leadframe.

9. The leadframe of claim 8, wherein the sidewalls of the indentation is substantially V-shaped.

* * * * *